(12) United States Patent
Villard

(10) Patent No.: US 7,625,103 B2
(45) Date of Patent: Dec. 1, 2009

(54) MULTIPLE THERMAL PATH PACKAGING FOR SOLID STATE LIGHT EMITTING APPARATUS AND ASSOCIATED ASSEMBLING METHODS

(75) Inventor: Russell George Villard, Apex, NC (US)

(73) Assignee: Cree, Inc., Durham, NC (US)

( * ) Notice: Subject to any disclaimer, the term of this patent is extended or adjusted under 35 U.S.C. 154(b) by 277 days.

(21) Appl. No.: 11/408,767

(22) Filed: Apr. 21, 2006

(65) Prior Publication Data
US 2007/0262337 A1    Nov. 15, 2007

(51) Int. Cl.
*F21V 29/00*    (2006.01)
(52) U.S. Cl. .................. 362/294; 362/249.02; 362/373
(58) Field of Classification Search ................ 362/227, 362/294, 310, 373, 543–547, 800; 257/712, 257/714, 717, 720, 721, 723; 165/65, 66; 174/252, 255, 256, 261, 266; 361/687–699
See application file for complete search history.

(56) References Cited

U.S. PATENT DOCUMENTS

| 1,565,500 | A | 12/1925 | Ritter |
| 3,805,937 | A | 4/1974 | Hatanaka et al. |
| 3,927,290 | A | 12/1975 | Denley |
| 4,163,277 | A | 7/1979 | Altman |
| 4,165,851 | A | 8/1979 | Bowden, Jr. et al. |
| 4,219,871 | A | 8/1980 | Larrimore |
| 4,325,146 | A | 4/1982 | Lennington |
| 4,388,677 | A | 6/1983 | Druffel |
| 4,408,157 | A | 10/1983 | Beaubien |
| 4,420,398 | A | 12/1983 | Castino |
| 5,087,883 | A | 2/1992 | Hoffman |
| 5,264,997 | A | 11/1993 | Hutchisson et al. |
| 5,386,959 | A | 2/1995 | Laughlin et al. |
| 5,407,799 | A | 4/1995 | Studier |
| 5,410,519 | A | 4/1995 | Hall et al. |
| 5,537,301 | A | 7/1996 | Martich |
| 5,563,849 | A | 10/1996 | Hall et al. |

(Continued)

FOREIGN PATENT DOCUMENTS

DE    195 28 459 A1    2/1997

(Continued)

OTHER PUBLICATIONS

U.S. Appl. No. 11/856,421, filed Sep. 17, 2007, Van De Ven.

(Continued)

*Primary Examiner*—Hargobind S Sawhney
(74) *Attorney, Agent, or Firm*—Myers Bigel Sibley & Sajovec, P.A.

(57) ABSTRACT

A mounting substrate includes a peripheral portion and a central portion. Solid state light emitting elements are provided on the mounting substrate. A housing is configured to thermally couple to the peripheral portion of the mounting substrate, so as to provide a first thermal conduction path for at least some heat generated by the solid state light emitting elements. A thermal conduction member is configured to thermally couple the central portion of the mounting substrate to the housing, so as to provide a second thermal conduction path that is different from the first thermal conduction path, for at least some heat generated by the solid state light emitting elements. Related assembling methods are also described.

29 Claims, 6 Drawing Sheets

U.S. PATENT DOCUMENTS

| | | | |
|---|---|---|---|
| 5,588,737 A | 12/1996 | Kusmer | |
| 5,632,551 A | 5/1997 | Roney et al. | |
| 5,697,696 A | 12/1997 | Kuroda et al. | |
| 5,725,302 A | 3/1998 | Sirkin | |
| 5,820,253 A | 10/1998 | Scholz | |
| 5,850,126 A | 12/1998 | Kanbar | |
| 5,924,785 A | 7/1999 | Zhang et al. | |
| 5,934,788 A | 8/1999 | Wolfe | |
| D417,305 S | 11/1999 | Pahl | |
| D417,306 S | 11/1999 | Pahl | |
| D417,307 S | 11/1999 | Pahl | |
| D417,746 S | 12/1999 | Pahl | |
| D417,747 S | 12/1999 | Pahl | |
| 6,076,788 A | 6/2000 | Akiyama | |
| 6,076,936 A | 6/2000 | George | |
| D428,516 S | 7/2000 | Reo et al. | |
| 6,082,870 A | 7/2000 | George | |
| D430,339 S | 8/2000 | Reo | |
| 6,095,666 A | 8/2000 | Salam | |
| 6,095,671 A | 8/2000 | Hutain | |
| D437,446 S | 2/2001 | Reo et al. | |
| D443,949 S | 6/2001 | DiMonte | |
| 6,292,901 B1 | 9/2001 | Lys et al. | |
| 6,335,538 B1 | 1/2002 | Prutchi et al. | |
| 6,340,868 B1 | 1/2002 | Lys et al. | |
| 6,348,766 B1 | 2/2002 | Ohishi et al. | |
| 6,350,043 B1 | 2/2002 | Gloisten | |
| 6,357,889 B1 | 3/2002 | Duggal et al. | |
| 6,394,621 B1 | 5/2002 | Hanewinkel, III | |
| 6,416,200 B1 | 7/2002 | George | |
| 6,428,189 B1 | 8/2002 | Hochstein | |
| 6,578,986 B2 | 6/2003 | Swaris et al. | |
| 6,578,998 B2 | 6/2003 | Zhang | |
| 6,624,350 B2 | 9/2003 | Nixon et al. | |
| 6,659,632 B2 * | 12/2003 | Chen | 362/545 |
| 6,712,486 B1 | 3/2004 | Popovich et al. | |
| 6,740,972 B2 * | 5/2004 | Smith et al. | 257/746 |
| 6,791,257 B1 | 9/2004 | Sato et al. | |
| 6,846,093 B2 | 1/2005 | Swaris et al. | |
| 6,880,954 B2 | 4/2005 | Ollett et al. | |
| 7,001,047 B2 | 2/2006 | Holder et al. | |
| 7,014,336 B1 | 3/2006 | Ducharme et al. | |
| 7,030,486 B1 * | 4/2006 | Marshall | 257/712 |
| 7,093,958 B2 | 8/2006 | Coushaine | |
| 7,095,110 B2 * | 8/2006 | Arik et al. | 257/712 |
| 7,102,172 B2 | 9/2006 | Lynch et al. | |
| 7,108,396 B2 | 9/2006 | Swaris et al. | |
| 7,114,831 B2 | 10/2006 | Popovich et al. | |
| 7,131,760 B2 | 11/2006 | Mayer et al. | |
| 7,144,140 B2 * | 12/2006 | Sun et al. | 362/373 |
| 7,178,941 B2 | 2/2007 | Roberge et al. | |
| 7,210,832 B2 * | 5/2007 | Huang | 362/547 |
| 7,213,940 B1 | 5/2007 | Van De Ven et al. | |
| 7,226,189 B2 * | 6/2007 | Lee et al. | 362/294 |
| 7,244,058 B2 | 7/2007 | DiPenti et al. | |
| 7,246,921 B2 | 7/2007 | Jacobson et al. | |
| 7,258,475 B2 * | 8/2007 | Kurumatani | 362/547 |
| 7,306,353 B2 | 12/2007 | Popovich et al. | |
| 7,329,024 B2 | 2/2008 | Lynch et al. | |
| 7,374,311 B2 | 5/2008 | Rains, Jr. et al. | |
| 7,387,406 B2 | 6/2008 | Swaris et al. | |
| 7,474,044 B2 | 1/2009 | Ge | |
| 2002/0006350 A1 | 1/2002 | Nishida et al. | |
| 2002/0087532 A1 | 7/2002 | Barritz et al. | |
| 2003/0006353 A1 | 1/2003 | Dinh et al. | |
| 2003/0117798 A1 | 6/2003 | Leysath | |
| 2003/0189831 A1 | 10/2003 | Yoneda | |
| 2003/0218878 A1 | 11/2003 | Swaris et al. | |
| 2004/0066142 A1 | 4/2004 | Stimac et al. | |
| 2004/0090794 A1 | 5/2004 | Ollett et al. | |
| 2004/0212998 A1 | 10/2004 | Mohacsi | |
| 2005/0051789 A1 | 3/2005 | Negley et al. | |
| 2005/0099478 A1 | 5/2005 | Iwase | |
| 2005/0111234 A1 | 5/2005 | Martin et al. | |
| 2005/0117332 A1 | 6/2005 | Maack | |
| 2005/0140270 A1 | 6/2005 | Henson et al. | |
| 2005/0161586 A1 | 7/2005 | Rains, Jr. et al. | |
| 2005/0168986 A1 | 8/2005 | Wegner | |
| 2005/0174780 A1 * | 8/2005 | Park | 362/294 |
| 2005/0237739 A1 | 10/2005 | Lee et al. | |
| 2005/0243556 A1 | 11/2005 | Lynch | |
| 2005/0247842 A1 | 11/2005 | Wronski | |
| 2005/0251698 A1 | 11/2005 | Lynch et al. | |
| 2005/0274972 A1 | 12/2005 | Roth et al. | |
| 2006/0081773 A1 | 4/2006 | Rains, Jr. et al. | |
| 2006/0098440 A1 * | 5/2006 | Allen | 362/294 |
| 2006/0141851 A1 | 6/2006 | Matsui et al. | |
| 2006/0243877 A1 | 11/2006 | Rippel | |
| 2006/0262545 A1 | 11/2006 | Piepgras et al. | |
| 2006/0267028 A1 | 11/2006 | Lynch et al. | |
| 2007/0041220 A1 | 2/2007 | Lynch | |
| 2007/0242441 A1 | 10/2007 | Aldrich et al. | |
| 2007/0247414 A1 | 10/2007 | Roberts | |
| 2008/0055915 A1 | 3/2008 | Lynch et al. | |
| 2008/0062699 A1 | 3/2008 | Popovich et al. | |
| 2008/0094850 A1 | 4/2008 | Woodward | |
| 2008/0103714 A1 | 5/2008 | Aldrich et al. | |
| 2008/0192462 A1 | 8/2008 | Steedly et al. | |

FOREIGN PATENT DOCUMENTS

| | | | |
|---|---|---|---|
| DE | 299 21 156 U1 | | 5/2000 |
| DE | 203 15 543 U1 | | 2/2004 |
| DE | 20 2004 003 793 U1 | | 5/2004 |
| DE | 10 2004 001 940 A1 | | 8/2005 |
| EP | 1 081 771 A2 | | 3/2001 |
| EP | 1 111 966 A2 | | 6/2001 |
| EP | 1 139 019 A1 | | 10/2001 |
| EP | 1 139 439 A1 | | 10/2001 |
| EP | 1 174 307 A2 | | 1/2002 |
| EP | 1 512 902 A2 | | 3/2005 |
| EP | 1 586 814 A2 | | 10/2005 |
| EP | 1 600 691 A1 | | 11/2005 |
| EP | 1 674 792 A2 | | 6/2006 |
| EP | 1 895 227 A1 | | 3/2008 |
| FR | 2 263 458 | | 10/1975 |
| GB | 1 494 493 | | 12/1977 |
| WO | WO 98/43014 | | 10/1998 |
| WO | WO 00/34709 | | 6/2000 |
| WO | WO 2004/071143 A1 | | 8/2004 |
| WO | WO 2006/033998 A1 | | 3/2006 |
| WO | WO 2006/128327 A1 | | 7/2006 |
| WO | WO 2006/127785 A2 | | 11/2006 |

OTHER PUBLICATIONS

U.S. Appl. No. 11/859,048, filed Sep. 21, 2007, Van De Ven.
U.S. Appl. No. 11/939,052, filed Nov. 13, 2007, Pickard.
U.S. Appl. No. 11/939,059, filed Nov. 13, 2007, Trott.
U.S. Appl. No. 12/114,994, filed May 5, 2008, Pickard.
U.S. Appl. No. 11/613,692, filed Dec. 20, 2006, Negley.
U.S. Appl. No. 11/743,754, filed May 3, 2007, Van De Ven.
U.S. Appl. No. 12/116,346, filed May 7, 2008, Pickard.
U.S. Appl. No. 12/116,348, filed May 7, 2008, Pickard.
Focal Point Web Material, "Focal Point® launches two dimensions of popular Sky™ family", p. 1 (2002), http://www.focalpointlights.com/news/pr_sky.htm, Last Download: Jul. 23, 2008.
Focal Point Web Material, "Sky™ 2×2", p. 1 (2002).
Focal Point Literature, "Sky™ 2×2", pp. 116-117, Dated: May 1, 2009.
Focal Point Literature, "Sky ™ 4×4", pp. 118-119, Dated: May 1, 2009.
Narendran et al., "Solid-state lighting: failure analysis of white LEDs", Journal of Cystal Growth, vol. 268, Issues 3-4 (Aug. 2004) Abstract.

OptoLED Product Sheets, http://www.optoled.de/englisch/products/led.html, pp. 1-7; Last Download: Jan. 16, 2009.

Permlight Product Sheet, http://www.permlightforsigns.com/, One page (Feb. 2005).

Prescolite Architektur LED Downlights, "Leading The Way: Introducing D6 LED & D4 LED", 8 pages (Sep. 2006).

European Search Report (8 pages) corresponding to European Application No. 06845870.2; Dated: Nov. 6, 2008.

International Search Report and Written Opinion (13 pages) corresponding to International Application No. PCT/US2007/078633; Mailing Date: Feb. 29, 2008.

International Search Report and Written Opinion (12 pages) corresponding to International Application No. PCT/US06/48521; Mailing date: Feb. 7, 2008.

International Search Report and Written Opinion (14 pages) corresponding to International Application No. PCT/US2007/084513; Mailing Date: Mar. 13, 2008.

International Search Report and Written Opinion (10 pages) corresponding to International Application No. PCT/US07/10766; Mailing Date: Sep. 24, 2008.

International Search Report and Written Opinion (15 pages) corresponding to International Application No. PCT/US2008/062610; Mailing Date: Oct. 31, 2008.

International Search Report and Written Opinion (12 pages) corresponding to International Application No. PCT/US2008/062825; Mailing Date: Jul. 16, 2008.

International Search Report and Written Opinion (15 pages) corresponding to International Application No. PCT/US2008/062826; Mailing Date: Jul. 16, 2008.

International Search Report and Written Opinion (17 pages) corresponding to International Application No. PCT/US2007/079123; Mailing Date: May 19, 2008.

International Search Report and Written Opinion (14 pages) corresponding to International Application No. PCT/US2007/084519; Mailing Date: Apr. 1, 2008.

* cited by examiner

MULTIPLE THERMAL PATH PACKAGING FOR SOLID STATE LIGHT EMITTING APPARATUS AND ASSOCIATED ASSEMBLING METHODS

FIELD OF THE INVENTION

This invention relates to solid state light emitting apparatus, and more particularly to packaging techniques and methods for solid state light emitting apparatus.

BACKGROUND OF THE INVENTION

Solid state light emitting apparatus are being widely designed and marketed as replacements for conventional incandescent lighting apparatus and/or other conventional lighting applications. Solid state light emitting apparatus can include solid state flashlights, spotlights, searchlights, headlights, pixels for arena displays, recessed lighting, light fixtures and/or other solid state lighting devices. Such solid state light emitting apparatus generally include a mounting substrate and a plurality of solid state light emitting elements, such as Light Emitting Diodes (LEDs), on the mounting substrate. A housing is configured for mounting the substrate therein. Optical elements, such as lenses, solid state light emitting element drivers and/or other support circuitry and/or a power source, such as a battery power supply and/or connections for an alternating current (AC)/direct current (DC) power supply, also may be provided. The solid state light emitting elements themselves may provide the appearance of white light, colored light and/or any other narrow or wideband light spectrum.

Although solid state light emitting elements, such as LEDs, may be more efficient that conventional incandescent light bulbs, the LEDs may still generate substantial heat under operating conditions, which may degrade device performance and/or reliability. Accordingly, when multiple LEDs are placed on a mounting substrate to provide a light emitting apparatus, thermal management techniques may be desired to dissipate heat and to maintain LED performance/reliability. Conventional techniques for thermal management may include mounting LEDs on thermally conductive media and/or the use of heat sinks. However, these techniques may not be as effective when used in at least partially enclosed housings.

SUMMARY OF THE INVENTION

Light emitting apparatus according to some embodiments of the present invention provide a mounting substrate that includes a peripheral portion and a central portion, a plurality of solid state light emitting elements on the mounting substrate, and a housing that is configured to thermally couple to the peripheral portion of the mounting substrate, so as to provide a first thermal conduction path for at least some heat generated by the solid state light emitting elements. A thermal conduction apparatus is configured to thermally couple the central portion of the mounting substrate to the housing, so as to provide a second thermal conduction path that is different from the first thermal conduction path, for at least some heat generated by the solid state light emitting elements. Multiple thermal path packaging for solid state light emitting apparatus is thereby provided.

In some embodiments, the housing is configured to thermally couple to the peripheral portion of the mounting substrate at a first portion of the housing, so as to provide the first thermal conduction path. The thermal conduction apparatus is configured to thermally couple the central portion of the mounting substrate to a second portion of the housing that is spaced apart from the first portion, to provide the second thermal conduction path.

In some embodiments, the housing is configured to thermally couple to the peripheral portion of the mounting substrate, so as to provide the first thermal conduction path through the peripheral portion of the mounting substrate to the housing. Accordingly, in these embodiments, the first thermal conduction path may be provided through the mounting substrate itself. In other embodiments, the thermal conduction apparatus is a first thermal conduction apparatus, and a second thermal conduction apparatus is provided that is configured to thermally couple the peripheral portion of the mounting substrate to the housing. Thus, in these embodiments, the first thermal conduction path may be provided at least partially through the second thermal conduction apparatus.

In some embodiments, the mounting substrate includes first and second opposing faces, the solid state light emitting devices are on the first face, and the thermal conduction apparatus thermally couples the central portion of the second face to the housing. In other embodiments, the second thermal conduction apparatus that was described above thermally couples the peripheral portion of the second face to the housing. In some embodiments, the second thermal conduction apparatus may be a ring-shaped member including a face that is coupled to the peripheral portion of the second face of the mounting substrate. The ring-shaped member includes an aperture therein, and the first thermal conduction apparatus extends through the aperture to the central portion of the second face of the mounting substrate. The housing may comprise a cylinder and the mounting substrate may comprise a disk that is mounted coaxially within the cylinder.

In some embodiments of the invention, the first thermal conduction apparatus may comprise at least one thermally conductive beam that extends between the central portion of the mounting substrate and the housing. The second thermal conduction apparatus may comprise a ring-shaped member including a face that is coupled to a face of the mounting substrate and that includes an aperture therein. The at least one thermally conductive beam may extend from the face of the mounting substrate at the central portion, through the aperture, to the housing. The at least one thermally conductive beam may be fixedly attached to both the mounting substrate and the housing in some embodiments of the invention. In other embodiments, the at least one thermally conductive beam may be fixedly attached to only one of the mounting substrate or the housing, and may be removably thermally coupled to the other one of the substrate or the housing a thermal grease and/or other non-fixed thermal coupling. In still other embodiments, the first thermal conduction apparatus comprises a thermally conductive fibrous pad (which may be analogized to a copper scouring pad) that extends between the central portion of the substrate and the housing. The fibrous pad may be attached to the mounting substrate/housing as was described above.

Light emitting apparatus according to other embodiments of the invention include a housing, a mounting substrate in the housing, a plurality of solid state light emitting elements on the mounting substrate, and a thermal conduction apparatus that is configured to thermally couple the mounting substrate to the housing, remote from the mounting substrate. As was described above, the thermal conduction apparatus can comprise at least one thermally conductive member such as a thermally conductive beam, a thermally conductive fibrous pad, and/or other thermally conductive elements.

Light emitting apparatus according to yet other embodiments of the invention include a cylindrical housing and a disk-shaped mounting substrate that includes first and second opposing faces, each face including a peripheral portion and a central portion, and being mounted coaxially in the cylindrical housing. A plurality of solid state light emitting elements are provided on the peripheral and central portions of the first face of the mounting substrate. At least one thermally conductive member extends from the central portion of the second face of the mounting substrate to the cylindrical housing remote from the second face. As was described above, the at least one thermally conductive member may be fixedly attached to the central portion of the second face of the mounting substrate, and fixedly attached to the cylindrical housing remote from the second face. A ring-shaped thermally conductive member also may be provided, having a face that is coupled to the peripheral portion of the second face of the mounting substrate and including an aperture therein, wherein the at least one thermally conductive member extends from the central portion of the second face of the mounting substrate, through the aperture, and to the cylindrical housing remote from the second face. As was described above, the at least one thermally conductive member can comprise at least one thermally conductive beam, a thermally conductive fibrous pad and/or other thermally conductive element.

Other embodiments of the invention provide methods of assembling a light emitting apparatus that includes a housing and a mounting substrate that has a peripheral portion and a central portion, and a plurality of solid state light emitting elements on the mounting substrate. These methods comprise inserting the mounting substrate into the housing and mounting at least one thermally conductive member in the housing to extend from the central portion of the mounting substrate to the housing remote from the mounting substrate. A beam, fibrous pad and/or other thermally conductive element may be used.

DETAILED DESCRIPTION

Figure 1:
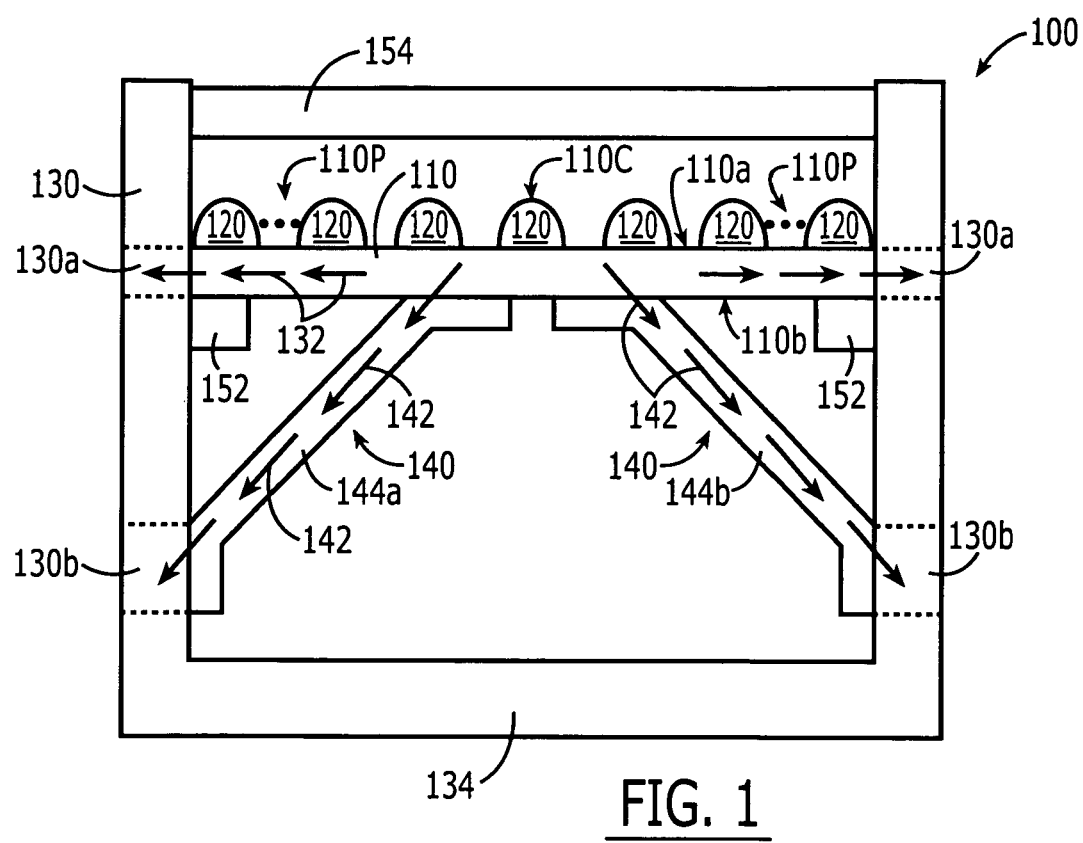
FIGS. 1-4 are cross-sectional views of light emitting apparatus according to various embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "included," "including," "have" and/or "having" when used in this specification, specify the presence of stated features, regions, steps, operations, elements, and/or components, but do not preclude the presence or addition of one or more other features, regions, steps, operations, elements, components, and/or groups thereof.

It will be understood that when an element, such as a layer or region, is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers, paths and/or sections, these elements, materials, regions, layers, paths and/or sections should not be limited by these terms. These terms are only used to distinguish one element, material, region, layer, path or section from another element, material, region, layer, path or section. Thus, a first thermal conduction path discussed below could be termed a second thermal conduction path, and vice versa, without departing from the teachings of the present invention.

Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a cross-sectional view of a light emitting apparatus according to some embodiments of the present invention. As shown in FIG. 1, these embodiments of a light emitting apparatus 100 include a mounting substrate 110 that includes a peripheral portion 110P and a central portion 110C. It will be understood by those having skill in the art that the peripheral and central portions 110P, 110C, respectively, need not include a defined boundary therebetween or a fixed ratio of sizes or areas. Rather, the terms "peripheral" and "central" generally refer to portions of the substrate 110 that are relatively close to the substrate edge and relatively remote from the substrate edge, respectively. A plurality of solid state light emitting elements 120 are provided on the mounting substrate 110. The light emitting elements may provide light of a given color, may provide the appearance of white light and/or may be tailored for any other desired lighting application. The plurality of solid state light emitting elements 120 need not be identical.

The design and operation of the mounting substrate 110 and the solid state light emitting elements 120 are well known to those having skill in the art, and need not be described in detail herein. In some embodiments, the mounting substrate 110 may comprise a conventional printed circuit board, a metal core printed circuit board, a solid metal block, a chip-on-board and/or other mounting substrates that are used with solid state light emitting elements. For example, a solid metal block mounting substrate is described in U.S. Patent Publication No. US 2005/0051789 to Negley et al., "*Solid Metal Block Mounting Substrates For Semiconductor Light Emitting Devices*", published Mar. 10, 2005, assigned to the assignee of the present invention, the disclosure of which is hereby incorporated herein by reference in its entirety as if set forth fully herein. Moreover, the solid state light emitting elements 120 may comprise Light Emitting Diodes (LEDs).

In some specific embodiments of the present invention, the mounting substrate 110 may be a metal core disk-shaped mounting substrate having a diameter of about 4.5" and a thickness of about 1/16". The LEDs may be XLamp® 7090 LEDs marketed by Cree, Inc., the assignee of the present application. In some embodiments, 11 XLamp 7090 LEDs 120 may be placed on 4.5" diameter metal core printed circuit board 110, for example, in two concentric arrays with 8 LEDs in the outer array and 3 LEDs in the inner array. However, it will be understood that many other configurations and arrangements of mounting substrates 110 and solid state light emitters 120 may be provided according to other embodiments of the present invention.

Still referring to FIG. 1, a housing 130 is provided that is configured to thermally couple to the peripheral portion 110P of the substrate 110, so as to provide a first thermal conduction path, indicated by arrows 132, for at least some heat generated by the solid state light emitting elements 120. In some specific embodiments, the housing 130 may comprise a cylinder of aluminum or other thermally conductive material that may be, for example, about 1/8" thick, about 5" long and may have an inside diameter of about 4.5". However, many other housing configurations may be employed. In some embodiments, the housing 130 at least partially encloses the solid state light emitting elements 120. An end cap 134 may be provided that is integral with the housing 130 or that may be attached thereto using threads, press fit, welding and/or other conventional attaching techniques.

Still referring to FIG. 1, a thermal conduction apparatus 140 is configured to thermally couple the central portion 110C of the mounting substrate 110 to the housing 130, so as to separately provide a second thermal conduction path, indicated by arrows 142, that is different from the first thermal conduction path 132, for at least some heat generated by the solid state light emitting elements 120.

Still referring to FIG. 1, a supporting member, such as a support lip 152 may be provided for supporting the mounting substrate 110. The lip 152 may be about 1/4" wide in some embodiments. An optically transparent element 154, such as a lens, glass, plastic element and/or other conventional optical element, may also be provided to allow light from the light emitting diodes 120 to exit the apparatus 100. As used herein, the term "transparent" means that least some of the incoming light passes through the transparent element. The transparent element 154 may be clear, colored, diffusive, translucent and/or partially opaque. Driving circuitry for the light emitting elements 120 also may be included. A power source, such as a battery, a connection to an external power supply (AC/DC) and/or other associated power supply circuitry may also be provided using techniques well known to those having skill in the art. An on/off switch also may be provided.

Still continuing with the description of FIG. 1, in some embodiments, the housing 130 may be configured to thermally couple to the peripheral portion 110P of the mounting substrate 110 at a first portion 130a of the housing 130, so as to provide the first thermal conduction path 132. The thermal conduction apparatus 140 may be configured to thermally couple the central portion 110C of the mounting substrate 110 to a second portion 130b of the housing 130, that is spaced apart from the first portion 130a, to provide the second thermal conduction path 142.

Moreover, as illustrated in FIG. 1, in some embodiments, the housing 130 may be configured to thermally couple to the peripheral portion 110P of the mounting substrate 110, so as to provide the first thermal conduction path 132 through the peripheral portion 110P of the mounting substrate 110 to the housing 130. Stated differently, in embodiments of FIG. 1, the first thermal conduction path 132 is provided at least partially through the peripheral portion 110P of the mounting substrate 110 itself. In other embodiments described below, other first thermal conduction paths may be provided. As also shown in FIG. 1, in some embodiments, the mounting substrate 110 includes first and second opposing faces 110a and 110b, respectively. The solid state light emitting devices 120 are on the first face 110a and the thermal conduction apparatus 140 thermally couples the central portion 110C of the second face 110b to the housing 130.

Figure 5:
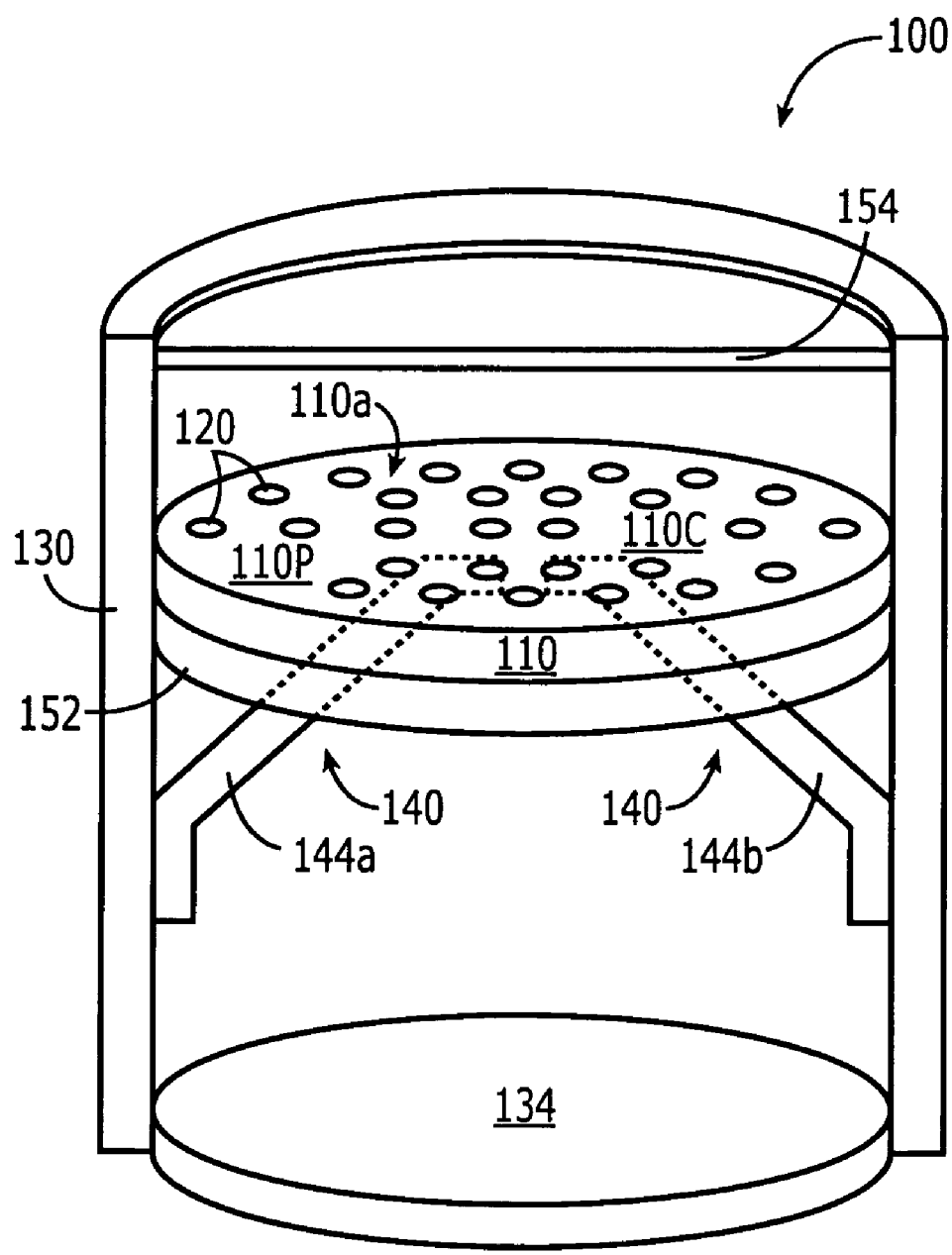
FIG. 5 is a perspective view of a light emitting apparatus of FIG. 1.

FIG. 5 is a perspective view of a light emitting apparatus 100 according to FIG. 1, which illustrates that, in some embodiments, the housing 130 may be a cylinder and the mounting substrate 110 may be a disk that is mounted coaxially with the cylinder. However, the housing 130 and/or mounting substrate 110 also may take on other shapes, such as ellipsoidal, polygonal and/or more complex shapes.

FIG. 1 also illustrates embodiments of the invention wherein the thermal conduction apparatus 140 comprises at least one thermally conductive beam 144a, 144b that extends between the central portion 110C of the mounting substrate 110 and the housing 130. In FIG. 1, two thermally conductive beams 144a, 144b are shown. However, only a single beam or more than two beams may be used. The beams may be distinct from one another or may be at least partially attached to one another. The beam(s) may be of various shapes, sizes and compositions.

In some embodiments, the at least one thermally conductive beam 144a, 144b is fixedly attached to both the mounting substrate 110 and the housing 130 using thermal epoxy, screws, welds, rivets and/or other conventional fixed attachments. In other embodiments, the at least one thermally conductive beam 144a, 144b is fixedly attached to only one of the mounting substrate 110 or the housing 130. Fixedly attaching only one end of the thermally conductive beam 144a, 144b may facilitate assembly. The end that is not fixedly attached (the "free" end of the beam) may be removably coupled to the housing 130 and/or the mounting substrate 110 using thermal grease and/or other thermally conductive non-epoxy material to promote thermal conduction. It will also be understood that each beam 144a, 144b may include multiple portions and may be fabricated from multiple materials. In some embodiments, the thermally conductive beams 144a, 144b may be fabricated from strips of aluminum that range from, for example, relatively thin pieces that are less than about 1/16" thick, to relatively thick pieces that are about 1/8" or more thick. Other materials that may be used include copper, graphite and/or other thermally conductive material(s). For example, in some embodiments, a conventional graphite crucible that may be at least partially cut into at least partially separated beams may be used.

Figure 2:
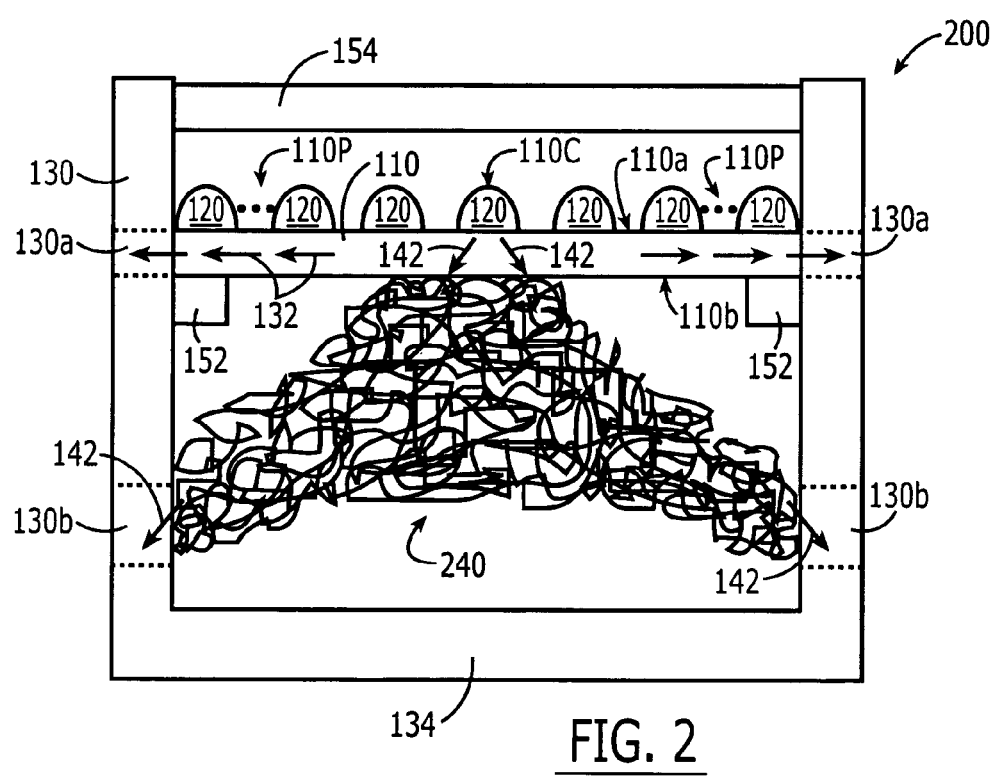

FIG. 2 is a cross-sectional view of a light emitting apparatus according to other embodiments of the present invention. These light emitting apparatus 200 may be similar to the light emitting apparatus 100 of FIG. 1, except that the thermal conduction apparatus 240 may comprise a thermally conductive fibrous pad, analogous to "steel wool", that extends between the central portion 110P of the substrate and the housing 130. The pad 240 may be fabricated from steel, copper and/or other thermally conductive material, and may be shaped to provide the second conductive path 142 from the central portion 110C of the mounting substrate 110 to the housing 130. A thermally conductive copper pad 240 such as the "copper scourer," marketed by Everyday Living, or other conventional copper scouring pads, may be used in some embodiments.

Figure 3:
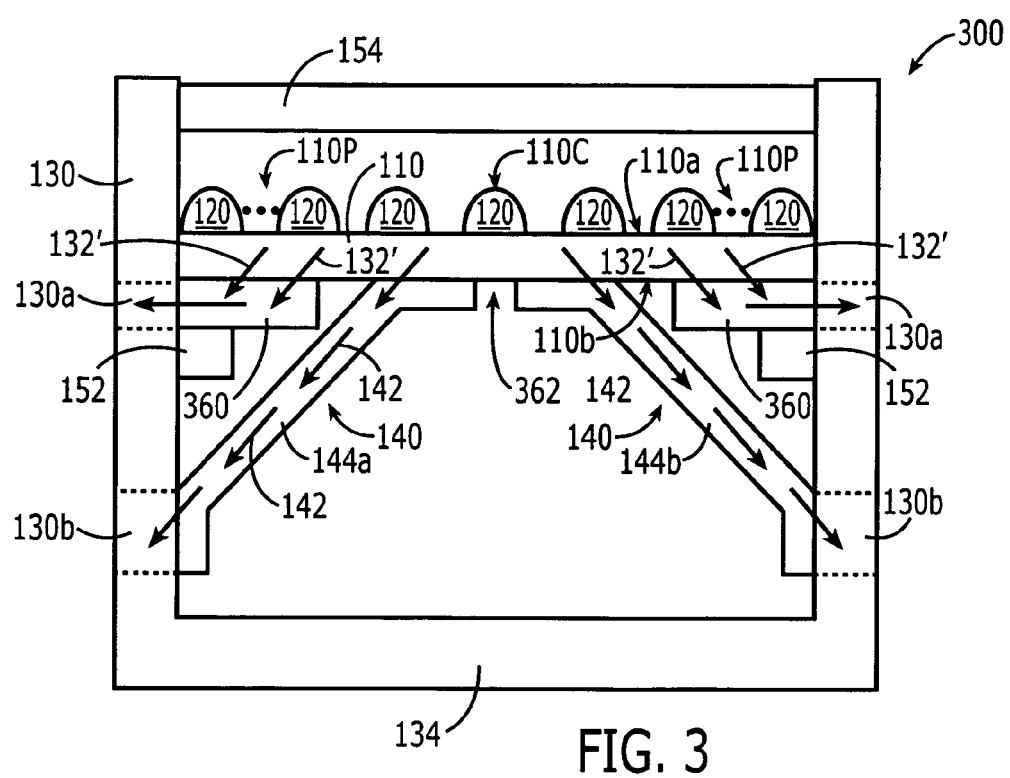

FIG. 3 is a cross-sectional view of a light emitting apparatus according to still other embodiments of the present invention. In these embodiments of light emitting apparatus 300, the thermal conduction apparatus 140 is a first thermal conduction apparatus, and a second thermal conduction apparatus 360 is provided that thermally couples the peripheral portion 110P of the second face 110b to the housing 130. In some embodiments, the second thermal conduction apparatus 360 is a ring-shaped member including a face that is coupled to the peripheral portion 110P of the second face 110b of the mounting substrate 110, and including an aperture 362 therein. In these embodiments, the first thermal conduction apparatus 140 may extend through the aperture 362 to the central portion 110C of the second face 110b of the mounting substrate 110.

Accordingly, in embodiments of FIG. 3, a second thermal conduction apparatus 360 may be provided, for example in the form of a ring-shaped member 360, that can provide additional thermal coupling for the first thermal path 132' therethrough. It will be understood that the first thermal path 132' may also extend through the mounting substrate 110 itself, as was indicated by arrows 132 of FIG. 1. Accordingly, a more efficient thermal path for the peripheral portion 110P of the mounting substrate 110 may be provided by the ring-shaped member 360, compared to embodiments of FIG. 1. In some embodiments, the ring-like member 360 may comprise a piece of aluminum, about 1/4" thick, having a diameter of about 4.5", and including therein an aperture 362 of about 2" in diameter. Increased side thermal coupling may thereby be provided. The ring-like thermally conductive member 360 may be fixedly/removably coupled to the mounting substrate 110 and/or to the housing 130 using thermal epoxy, screws and/or other conventional techniques that can provide good thermal coupling therebetween.

Figure 4:
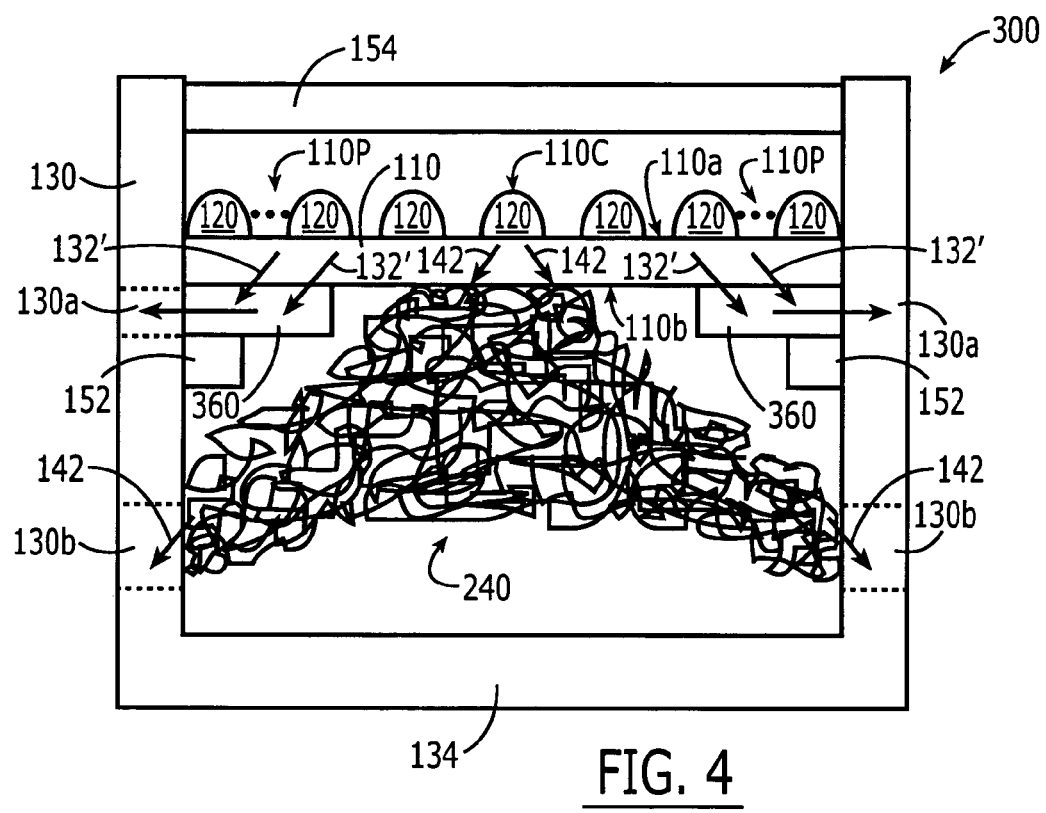

FIG. 4 illustrates other embodiments of the present invention wherein the first thermal conduction apparatus comprises a thermally conductive fibrous pad 240 and wherein a second thermal conductive apparatus 360 also is provided. It will also be understood that various aspects of embodiments of the invention that were described in connection with FIGS. 1-5 may be combined in various combinations and subcombinations.

Figure 6:
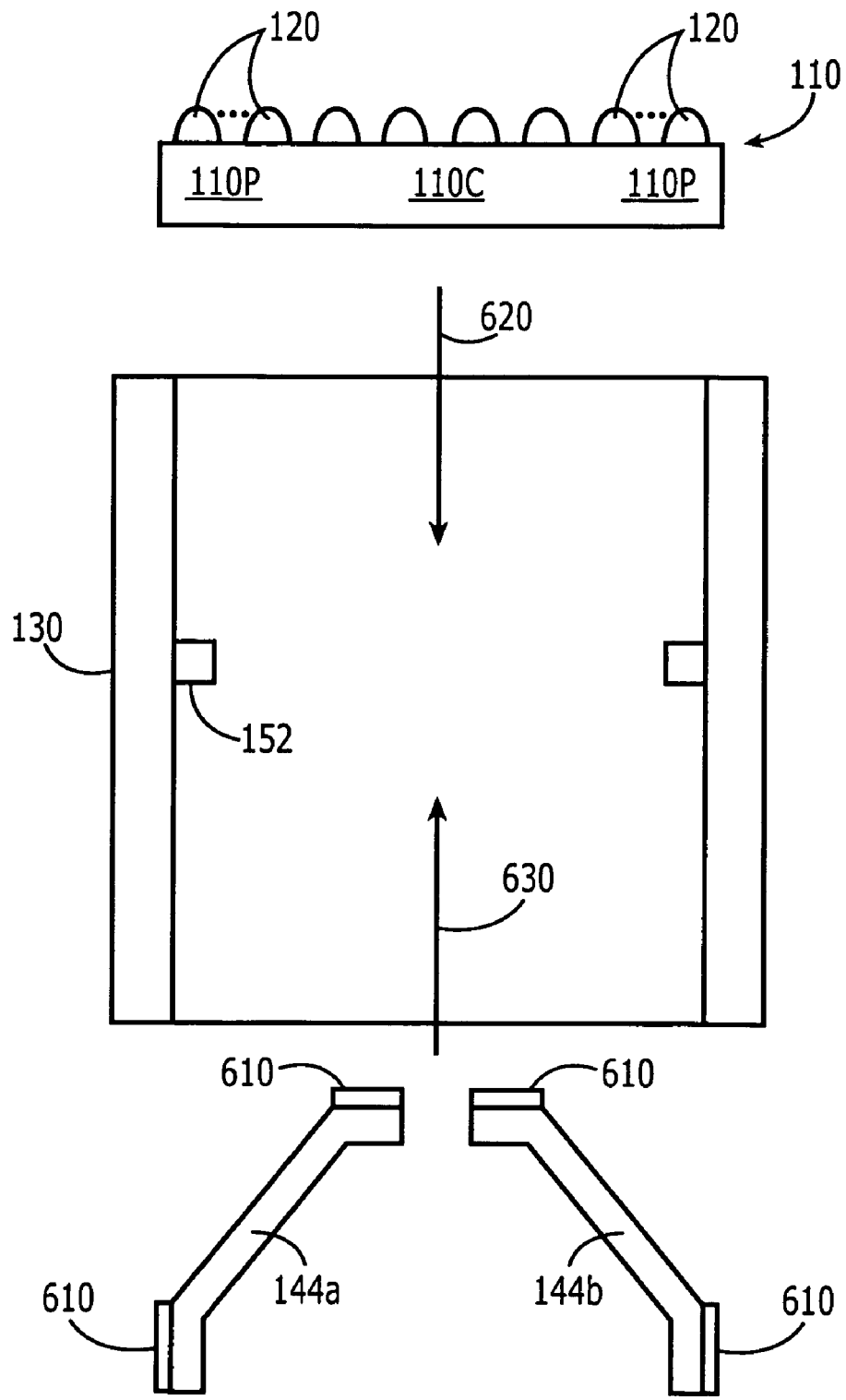
FIG. 6 is an exploded view of a light emitting apparatus of FIG. 1 illustrating methods of assembling same.

FIG. 6 is an exploded view that schematically illustrates methods of assembling light emitting apparatus according to some embodiments of the present invention. FIG. 6 illustrates embodiments of FIGS. 1 and 5. However, similar assembly methods may be used to assemble other embodiments described herein.

Referring now to FIG. 6, a first arrow 620 indicates inserting a mounting substrate, such as the mounting substrate 110 described above, into a housing, such as the housing 130 described above. The amount of insertion may be guided by a lip, such as the lip 152 described above. A second arrow 630 illustrates mounting at least one thermally conductive member, such as the thermally conductive beams 144a, 144b described above, in the housing 130, to extend from the central portion 110C of the mounting substrate 110 to the housing 130 remote from the mounting substrate 110. In FIG. 6, thermal epoxy 610 may be used to attach the thermally conductive beams 144a, 144b to the mounting substrate 110 and to the housing 130. However, in other embodiments, other techniques for fixed and/or removable attachment may be used.

It will be understood that the operations indicated by arrows 620 and 630 may be performed in the reverse order from that which was described above. Moreover, the operations of arrows 620 and 630 may be performed at least partially simultaneously. For example, the thermally conductive members 144a, 144b may be attached to the mounting substrate 110 prior to inserting the mounting substrate 110 into the housing 130. Thereafter and/or beforehand, other components of the light emitting apparatus, such as end caps, optical elements, other circuitry, on/off switches and/or power supplies may be assembled.

Accordingly, some embodiments of the invention can use thermally conductive elements to create multiple conduction paths away from the light emitting devices to the housing. Some embodiments of the invention may arise from recognition that it may be desirable to provide additional heat dissipation in the center of an enclosed LED structure where the LEDs are mounted together. In particular, the LEDs may dissipate heat uniformly in all directions, but the heat may be more easily removed from the periphery of the mounting substrate than from the center of the mounting substrate. Thus, heat from the LEDs may build up if not pulled from the center. Some embodiments of the invention can tack a thermally conductive material to the center of the heat generation area, to create a thermal path that redirects heat flow to sides of the housing (enclosure). Accordingly, heat may dissipate through the housing around the edges of the LED array and heat may also be directed away from the center of the LED array to a different portion of the housing by the thermally conductive elements. Embodiments of the present invention may be particularly useful for flashlights, spotlights, recessed lighting or any other LED applications with enclosed or partially enclosed housings.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting apparatus comprising:
a mounting substrate that includes a peripheral portion and a central portion;
a plurality of solid state light emitting elements on the mounting substrate;
a housing that provides a first thermal conduction path for at least some heat generated by the solid state light emitting elements; by being in contact with the peripheral portion of the mounting substrate
a first thermal conduction apparatus that provides a second thermal conduction path that is different than the first thermal conduction path to the housing for at least some heat generated by the solid state light emitting elements; by being in contact with the central portion of the mounting substrate and
a second thermal conduction apparatus that provides a third thermal conduction path to the housing that is different than the first and second thermal conduction paths for at least some heat generated by the solid state light emitting elements by being in contact with an intermediate portion of the mounting substrate that is between the central portion and the peripheral portion.

2. A light emitting apparatus according to claim 1 wherein the housing provides the first thermal conduction path through the peripheral portion of the mounting substrate to the housing.

3. A light emitting apparatus according to claim 1 wherein the mounting substrate includes first and second opposing faces, wherein the solid state light emitting devices are on the first face and wherein the first thermal conduction apparatus provides the second thermal conduction path to the housing by being in contact with the central portion of the second face.

4. A light emitting apparatus according to claim 1 wherein the mounting substrate includes first and second opposing faces, wherein the solid state light emitting devices are on the first face, wherein the first thermal conduction apparatus provides the second thermal conduction path to the housing by being in contact with the central portion of the second face and wherein the second thermal conduction apparatus provides the third thermal conduction path to the housing by being in contact with the intermediate portion of the second face.

5. A light emitting apparatus according to claim 4 wherein the second thermal conduction apparatus is a ring-shaped member including a face that is in contact with the intermediate portion of the second face of the mounting substrate and including an aperture therein, and wherein the first thermal conduction apparatus extends through the aperture to the central portion of the second face of the mounting substrate.

6. A light emitting apparatus according to claim 1 wherein the housing comprises a cylinder and wherein the mounting substrate comprises a disk that is mounted coaxially within the cylinder.

7. A light emitting apparatus according to claim 1 wherein the first thermal conduction apparatus comprises at least one thermally conductive beam that extends between the central portion of the mounting substrate and the housing.

8. A light emitting apparatus according to claim 7 wherein the at least one thermally conductive beam is fixedly attached to both the mounting substrate and the housing.

9. A light emitting apparatus according to claim 7 wherein the at least one thermally conductive beam is fixedly attached to only one of the mounting substrate or the housing.

10. A light emitting apparatus according to claim 1 wherein the housing comprises a cylinder, wherein the mounting substrate comprises a disk, wherein the second thermal conduction apparatus comprises a ring-shaped member including a face that is in contact with a face of the mounting substrate at the intermediate portion and includes an aperture therein, and wherein the first thermal conduction apparatus comprises at least one thermally conductive beam that extends from the face of the mounting substrate at the central portion, through the aperture to the housing.

11. A light emitting apparatus according to claim 1 wherein the first thermal conduction apparatus comprises a thermally conductive fibrous pad that extends between the central portion of the mounting substrate and the housing.

12. A light emitting apparatus according to claim 11 wherein the thermally conductive fibrous pad comprises a copper scouring pad.

13. A light emitting apparatus according to claim 1 wherein the plurality of solid state light emitting elements comprise a plurality of light emitting diodes.

14. A light emitting apparatus according to claim 1 wherein the housing comprises a metal cylinder.

15. A light emitting apparatus according to claim 1 wherein:
the housing provides the first thermal conduction path by being in contact with the peripheral portion of the mounting substrate at a first portion of the housing;
the first thermal conduction apparatus provides the second thermal conduction path by being in contact with the central portion of the mounting substrate and a second portion of the housing that is spaced apart from the first portion; and
the second thermal conduction apparatus provides the third thermal conduction path by being in contact with the intermediate portion of the mounting substrate and a third portion of the housing, wherein the third portion of the housing is located between the first and second portions of the housing.

16. A light emitting apparatus comprising:
a cylindrical housing;
a disk-shaped mounting substrate that includes first and second opposing faces, each face including a peripheral portion and a central portion, and being mounted coaxially in the cylindrical housing;
a plurality of solid state light emitting elements on the peripheral and central portions of the first face of the mounting substrate, wherein the cylindrical housing provides a first thermal conduction path for at least some heat generated by the solid state light emitting elements; by being in contact with the peripheral portion of the mounting substrate;
a first thermal conduction apparatus comprising at least one thermally conductive member that extends from the central portion of the second face of the mounting substrate to the cylindrical housing remote from the second face, the first thermal conduction apparatus provides a second thermal conduction path to the cylindrical housing that is different than the first thermal conduction path for at least some heat generated by the solid state light emitting elements by being in contact with the central portion of the mounting substrate; and a second thermal conduction apparatus comprising a ring-shaped thermally conductive member having a face that is in contact with an intermediate portion of the second face of the mounting substrate that is between the central portion and the peripheral portion of the second face of the mounting substrate and including an aperture therein, the second thermal conduction apparatus providing a third thermal conduction path to the housing that is different than the first and second thermal conduction paths for at least some heat generated by the solid state light emitting elements by being in contact with the intermediate portion of the mounting substrate, wherein the at least one thermally conductive member extends from the central portion of the second face of the mounting substrate, through the aperture and to the cylindrical housing remote from the second face.

17. A light emitting apparatus according to claim 16 wherein the at least one thermally conductive member is fixedly attached to the central portion of the second face of the mounting substrate and is fixedly attached to the cylindrical housing remote from the second face.

18. A light emitting apparatus according to claim 16 wherein the plurality of solid state light emitting elements comprise a plurality of light emitting diodes.

19. A light emitting apparatus according to claim 16 wherein:
the cylindrical housing provides the first thermal conduction path by being in contact with the peripheral portion of the mounting substrate at a first portion of the cylindrical housing;
the first thermal conduction apparatus provides the second thermal conduction path by being in contact with the central portion of the mounting substrate and a second portion of the cylindrical housing that is spaced apart from the first portion; and
the second thermal conduction apparatus provides the third thermal conduction path by being in contact with; and the intermediate portion of the mounting substrate to a third portion of the cylindrical housing, wherein the third portion of the cylindrical housing is located between the first and second portions of the cylindrical housing.

20. A light emitting apparatus according to claim 16 wherein the at least one thermally conductive member comprises a thermally conductive fibrous pad that extends from the central portion of the second face of the mounting substrate to the cylindrical housing remote from the second face.

21. A light emitting apparatus according to claim 20 wherein the thermally conductive fibrous pad comprises a copper scouring pad.

22. A method of assembling a light emitting apparatus that includes a housing that has a support lip and a mounting substrate that has a peripheral portion and a central portion, and a plurality of solid state light emitting elements on the mounting substrate, the method comprising:
inserting the mounting substrate into the housing and onto the support lip; and
mounting at least one thermally conductive fibrous pad in the housing to extend from the central portion of the mounting substrate to the housing remote from the mounting substrate.

23. A method according to claim 22 wherein the plurality of solid state light emitting elements comprise a plurality of light emitting diodes.

24. A light emitting apparatus according to claim 22 wherein the thermally conductive fibrous pad comprises a copper scouring pad.

25. A light emitting apparatus comprising:
a mounting substrate that includes a peripheral portion and a central portion;
a plurality of solid state light emitting elements on the mounting substrate, the mounting substrate configured to provide a first thermal conduction path from the central portion to the peripheral portion for at least some heat generated by the plurality of solid state light emitting elements;
a first thermal conduction apparatus that provides a second thermal conduction path that is different than the first thermal conduction path from the central portion therethrough for at least some heat generated by the plurality of solid state light emitting elements by being in contact with the central portion of the mounting substrate; and
a second thermal conduction apparatus that provides a third thermal conduction path that is different than the first and second thermal conduction paths for at least some heat generated by the plurality of light emitting elements by being in contact with an intermediate portion of the mounting substrate that is between the central portion and the peripheral portion,
wherein the first thermal conduction apparatus comprises a thermally conductive fibrous pad that is in contact with the central portion of the mounting substrate.

26. A light emitting apparatus according to claim 25 wherein the mounting substrate includes first and second opposing faces, wherein the solid state light emitting devices are on the first face and wherein the first thermal conduction apparatus is in contact with the central portion of the second face.

27. A light emitting apparatus according to claim 25 wherein the mounting substrate includes first and second opposing faces, wherein the solid state light emitting devices are on the first face, wherein the second thermal conduction apparatus is a ring-shaped member including a face that is in contact with the intermediate portion of the second face of the mounting substrate and including an aperture therein, and wherein the first thermal conduction apparatus extends through the aperture to the central portion of the second face of the mounting substrate.

28. A light emitting apparatus according to claim 25 wherein the plurality of solid state light emitting elements comprise a plurality of light emitting diodes.

29. A light emitting apparatus according to claim 25 wherein the thermally conductive fibrous pad comprises a copper scouring pad.

* * * * *

UNITED STATES PATENT AND TRADEMARK OFFICE
CERTIFICATE OF CORRECTION

PATENT NO. : 7,625,103 B2
APPLICATION NO. : 11/408767
DATED : December 1, 2009
INVENTOR(S) : Villard It is certified that error appears in the above-identified patent and that said Letters Patent is hereby corrected as shown below:

In the Claims
Column 9, Claim 1, Line 18: Please delete ";"
Claim 1, Line 19: Please add -- ; -- after "substrate"
Claim 1, Line 21: Please correct claim by adding -- to the housing -- after "conduction path"
Claim 1, Line 22: Please delete "to the housing"
Claim 1, Line 23: Please delete ";"
Claim 1, Line 25: Please add -- ; -- after "substrate"

Column 10, Claim 16, Line 54: Please replace "provides" with -- providing --
Claim 16, Line 55: Please delete ";"
Claim 16, Line 62: Please correct "provides" to read -- providing --

Column 11, Claim 19, Line 38: Please delete "; and" after "in contact with"
Claim 19, Line 39: Please correct "mounting substrate to a" to read
-- mounting substrate and a --

Signed and Sealed this

Second Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,625,103 B2  
APPLICATION NO. : 11/408767  
DATED : December 1, 2009  
INVENTOR(S) : Russell George Villard It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 496 days.

Signed and Sealed this

Twenty-sixth Day of October, 2010

David J. Kappos
*Director of the United States Patent and Trademark Office*